US009349543B2

(12) United States Patent
Lyon et al.

(10) Patent No.: US 9,349,543 B2
(45) Date of Patent: May 24, 2016

(54) NANO TRI-CARBON COMPOSITE SYSTEMS AND MANUFACTURE

(71) Applicants: Bradley Lyon, Arcadia, CA (US); Adrianus I. Aria, Cambridge (GB); Morteza Gharib, Altadena, CA (US)

(72) Inventors: Bradley Lyon, Arcadia, CA (US); Adrianus I. Aria, Cambridge (GB); Morteza Gharib, Altadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 365 days.

(21) Appl. No.: 13/953,618

(22) Filed: Jul. 29, 2013

(65) Prior Publication Data
US 2014/0029163 A1 Jan. 30, 2014

Related U.S. Application Data

(60) Provisional application No. 61/677,132, filed on Jul. 30, 2012, provisional application No. 61/677,115, filed on Jul. 30, 2012.

(51) Int. Cl.
| | |
|---|---|
| *H01G 9/00* | (2006.01) |
| *H01G 11/36* | (2013.01) |
| *H01G 11/28* | (2013.01) |
| *H01G 11/70* | (2013.01) |
| *B81C 1/00* | (2006.01) |

(52) U.S. Cl.
CPC ............ *H01G 11/36* (2013.01); *B81C 1/00031* (2013.01); *H01G 11/28* (2013.01); *H01G 11/70* (2013.01); *B81B 2203/0361* (2013.01); *Y02E 60/13* (2013.01); *Y10T 428/30* (2015.01)

(58) Field of Classification Search
None
See application file for complete search history.

(56) References Cited

U.S. PATENT DOCUMENTS

| | | | |
|---|---|---|---|
| 3,964,482 | A | 6/1976 | Gerstel et al. |
| 4,842,390 | A | 6/1989 | Sottini et al. |
| 5,116,317 | A | 5/1992 | Carson, Jr. et al. |
| 5,457,041 | A | 10/1995 | Ginaven et al. |
| 6,256,533 | B1 | 7/2001 | Yuzhakov et al. |

(Continued)

FOREIGN PATENT DOCUMENTS

| | | |
|---|---|---|
| EP | 1948562 B1 | 7/2010 |
| JP | 2006-114265 | 4/2006 |

(Continued)

OTHER PUBLICATIONS

U.S. Appl. No. 14/807,775 Office Action, Jan. 21, 2016.

(Continued)

*Primary Examiner* — Seahvosh Nikmanesh
(74) *Attorney, Agent, or Firm* — One LLP

(57) ABSTRACT

Nano-carbon material is described that combines the common and unique properties of spherical fullerenes, carbon nanotubes and graphene carbon allotropes to create an architecture that has unique mechanical and electrical properties. The combined tensile strength of graphene with the compressive strength of fullerenes attached to nanotubes creates a high strength material. By attaching fullerenes to nanotubes, the surface area of the material is greatly enhanced beyond the high surface area normally associated with vertically aligned nanotube arrays. Fabrication can be performed via several complementary methods including catalyst deposition, hydrocarbon chemical vapor deposition, and surface functionalization. The fabrication of the NTC is based on its sub-composites: graphene-nanotubes and nanotubes-fullerenes and their respective fabrication processes.

14 Claims, 2 Drawing Sheets

(56) References Cited

U.S. PATENT DOCUMENTS

| | | |
|---|---|---|
| 6,334,856 B1 | 1/2002 | Allen et al. |
| 6,379,324 B1 | 4/2002 | Gartstein et al. |
| 6,471,903 B2 | 10/2002 | Sherman et al. |
| 6,503,231 B1 | 1/2003 | Prausnitz et al. |
| 6,533,949 B1 | 3/2003 | Yeshurun et al. |
| 6,720,547 B1 | 4/2004 | Rajadhyaksha et al. |
| 6,749,792 B2 | 6/2004 | Olson |
| 6,866,801 B1 | 3/2005 | Mau et al. |
| 6,924,335 B2 | 8/2005 | Fan et al. |
| 7,037,562 B2 | 5/2006 | Jimenez |
| 7,097,776 B2 | 8/2006 | Govinda Raju |
| 7,160,620 B2 | 1/2007 | Huang et al. |
| 7,183,003 B2 | 2/2007 | Leu et al. |
| 7,235,442 B2 | 6/2007 | Wang et al. |
| 7,291,396 B2 | 11/2007 | Huang et al. |
| 7,393,428 B2 | 7/2008 | Huang et al. |
| 7,396,477 B2 | 7/2008 | Hsiao |
| 7,438,844 B2 | 10/2008 | Huang et al. |
| 7,491,628 B2 | 2/2009 | Noca et al. |
| 7,534,648 B2 | 5/2009 | Raravikar et al. |
| 7,569,425 B2 | 8/2009 | Huang et al. |
| 7,611,628 B1 | 11/2009 | Hinds, III |
| 7,611,651 B2 | 11/2009 | Huang et al. |
| 7,695,769 B2 | 4/2010 | Watanabe et al. |
| 7,955,644 B2 | 6/2011 | Sansom et al. |
| 8,043,250 B2 | 10/2011 | Xu |
| 8,048,017 B2 | 11/2011 | Xu |
| 8,062,573 B2 | 11/2011 | Kwon |
| 8,257,324 B2 | 9/2012 | Prausnitz et al. |
| 8,377,590 B2 | 2/2013 | Park et al. |
| 8,663,593 B2 * | 3/2014 | Yoo ................ B82Y 30/00 423/447.1 |
| 2001/0023986 A1 | 9/2001 | Mancevski |
| 2002/0155737 A1 | 10/2002 | Roy et al. |
| 2002/0172820 A1 | 11/2002 | Majumdar et al. |
| 2003/0069548 A1 | 4/2003 | Connelly et al. |
| 2003/0119920 A1 | 6/2003 | Wang et al. |
| 2003/0180472 A1 | 9/2003 | Zhou et al. |
| 2005/0011858 A1 | 1/2005 | Kuo et al. |
| 2005/0029223 A1 | 2/2005 | Yeshurun et al. |
| 2005/0067346 A1 | 3/2005 | Noack et al. |
| 2005/0100960 A1 | 5/2005 | Dai et al. |
| 2005/0127351 A1 | 6/2005 | Tolt |
| 2005/0157386 A1 | 7/2005 | Greenwald et al. |
| 2005/0167647 A1 | 8/2005 | Huang et al. |
| 2005/0171480 A1 | 8/2005 | Mukerjee et al. |
| 2005/0220674 A1 | 10/2005 | Shafirstein et al. |
| 2005/0230082 A1 | 10/2005 | Chen |
| 2005/0245659 A1 | 11/2005 | Chen |
| 2006/0030812 A1 | 2/2006 | Golubovic-Liakopoulos et al. |
| 2006/0057388 A1 | 3/2006 | Jin et al. |
| 2006/0073712 A1 | 4/2006 | Suhir |
| 2006/0084942 A1 | 4/2006 | Kim et al. |
| 2006/0093642 A1 | 5/2006 | Ranade |
| 2006/0118791 A1 | 6/2006 | Leu et al. |
| 2006/0184092 A1 | 8/2006 | Atanasoska et al. |
| 2006/0184112 A1 | 8/2006 | Horn et al. |
| 2006/0226016 A1 | 10/2006 | Govinda Raju et al. |
| 2006/0231970 A1 | 10/2006 | Huang et al. |
| 2006/0286305 A1 | 12/2006 | Thies et al. |
| 2007/0053057 A1 | 3/2007 | Zust et al. |
| 2007/0066934 A1 | 3/2007 | Etheredge et al. |
| 2007/0066943 A1 | 3/2007 | Prasad et al. |
| 2007/0081242 A1 | 4/2007 | Kempa et al. |
| 2007/0099311 A1 | 5/2007 | Zhou et al. |
| 2007/0114658 A1 | 5/2007 | Dangelo et al. |
| 2007/0207182 A1 | 9/2007 | Weber et al. |
| 2007/0244245 A1 | 10/2007 | Liu et al. |
| 2007/0276330 A1 | 11/2007 | Beck et al. |
| 2008/0009800 A1 | 1/2008 | Nickel |
| 2008/0199626 A1 | 8/2008 | Zhou et al. |
| 2008/0269666 A1 | 10/2008 | Wang et al. |
| 2008/0292840 A1 | 11/2008 | Majumdar et al. |
| 2008/0318049 A1 | 12/2008 | Hata et al. |
| 2009/0032496 A1 | 2/2009 | Yao et al. |
| 2009/0068387 A1 | 3/2009 | Panzer et al. |
| 2009/0118662 A1 | 5/2009 | Schnall |
| 2009/0130370 A1 | 5/2009 | Sansom et al. |
| 2009/0208743 A1 | 8/2009 | Petit |
| 2009/0269560 A1 | 10/2009 | Dhinojwala et al. |
| 2010/0075024 A1 | 3/2010 | Ajayan et al. |
| 2010/0196446 A1 | 8/2010 | Gharib et al. |
| 2010/0247777 A1 | 9/2010 | Nikolaev et al. |
| 2010/0253375 A1 | 10/2010 | Fang et al. |
| 2010/0330277 A1 | 12/2010 | Ajayaghosh et al. |
| 2011/0045080 A1 | 2/2011 | Powis et al. |
| 2011/0077172 A1 | 3/2011 | Aizenberg et al. |
| 2011/0233779 A1 | 9/2011 | Wada et al. |
| 2011/0250376 A1 | 10/2011 | Aria et al. |
| 2012/0021164 A1 | 1/2012 | Sansom et al. |
| 2012/0058170 A1 | 3/2012 | Gharib et al. |
| 2013/0178722 A1 | 7/2013 | Aria et al. |

FOREIGN PATENT DOCUMENTS

| | | |
|---|---|---|
| JP | 2006-164835 | 6/2006 |
| TW | 253 898 | 4/2006 |
| TW | 256 877 | 6/2006 |
| WO | WO 96/21938 A1 | 7/1996 |
| WO | WO 2006/041535 A1 | 4/2006 |
| WO | WO 2010/087971 A2 | 8/2010 |
| WO | WO 2010/120564 A2 | 10/2010 |
| WO | WO 2013/090844 A1 | 6/2013 |

OTHER PUBLICATIONS

WO, PCT/US2013/052580 ISR, Oct. 16, 2013.

Boyea, J.M. et al., "Carbon Nanotube-Based Supercapacitors: Technologies and Markets", Nanotechnology Law & Business, Mar. 2007, vol. 4, No. 1, pp. 585-593.

Kim, Youn-Su et al., "Out-of-plane growth of CNTs on grapheme for supercapacitor applications", Nanotechnology, 2012, vol. 23, pp. 1-7.

Cheng, Li et al., "A fullerene-single wall carbon nanotube complex for polymer bulk heterojunction photovoltaic cells", J. Matter. Chem., 2007, vol. 17, pp. 2406-2411.

Zhang, Li Li et al., "Graphene-based materials as supercapacitor electrodes", J. Matter. Chem., 2010, vol. 20, pp. 5893-5992.

WO, PCT/US2007/015754 IPRP, Feb. 2, 2010.
WO, PCT/US2008/012641 IPRP, May 11, 2010.
WO, PCT/US2010/000243 IPRP, Aug. 2, 2011.
WO, PCT/US2011/031465 IPRP, Dec. 27, 2011.
WO, PCT/US2012/069941 IPRP, Jun. 17, 2014.
WO, PCT/US2008/012641 ISR, Dec. 2, 2009.
WO, PCT/US2007/015754 ISR, Jan. 25, 2010.
WO, PCT/US2010/000243 ISR, Nov. 11, 2010.
WO, PCT/US2011/031465 ISR, Dec. 27, 2011.
WO, PCT/US2012/069941 ISR, Feb. 21, 2013.

Ajayan, P.M., et al., "Aligned Carbon Nanotube Arrays Formed by Cutting a Polymer Resin-Nanotube Composite", Science, vol. 265, No. 5176, Aug. 1994, pp. 1212-1214.

Anderson, A., et al., "High sensitivity assays for docetaxel and paclitaxel in plasma using solid-phase extraction and high-performance liquid chromatography with UV detection", BMC Clinical Pharmacology, Jan. 2006, vol. 6, Issue 2, pp. 1-10.

Arakawa, K., et al., "Fluorescence Analysis of Biochemical Constituents Identifies Atherosclerotic Plaque With a Thin Fibrous Cap", Arterioscler. Thromb. Vasc. Biol., 2002, vol. 22, pp. 1002-1007.

Aria, A.I., et al., "Reversible Tuning of the Wettability of Carbon Nanotube Arrays: The Effect of Ultraviolet/Ozone and Vacuum Pyrolysis Treatments", Langmuir, 2011, vol. 27, pp. 9005-9011.

Arifin, D.Y., et al., "Role of Convective Flow in Carmustine Delivery to a Brain Tumor", Pharmaceutical Research, 2009, pp. 1-14.

Barber, A.H., et al., "Static and Dynamic Wetting Measurements of Single Carbon Nanotubes", Physical Review Letters, vol. 92, No. 18, May 2004, pp. 186103-1-186103-4.

Boldor, D., et al., "Temperature Measurement of Carbon Nanotubes Using Infrared Thermography", Chem. Matter. vol. 20, No. 12, 2008, pp. 4011-4016.

(56) References Cited

OTHER PUBLICATIONS

Boo, H., et al., "Electrochemical Nanoneedle Biosensor Based on Multiwall Carbon Nanotube", Anal. Chem., vol. 78, No. 2, 2006, pp. 617-620.
Borca-Tasciuc, T., et al., "Anisotropic Thermal Diffusivity Characterization of Aligned Carbon Nanotube-Polymer Composites", Journal of Nanoscience and Nanotechnology, vol. 7, No. 4, 2007, pp. 1581-1588.
Bronikowski, M.J., "CVD growth of carbon nanotube bundle arrays", Carbon, 2006, vol. 44, pp. 2822-2832.
Bronikowski, M.J., "Longer Nanotubes at Lower Temperatures: The Influence of Effective Activation Energies on Carbon Nanotube Growth by Thermal Chemical Vapor Deposition", J. Phys. Chem. C, vol. 111, No. 48, 2007, pp. 17705-17712.
Celermajer, D.S., "Understanding the pathophysiology of the arterial wall: which method should we choose?", European Heart Journal Supplements, 2002, vol. 4, Supplement F, pp. F24-F28.
Chen, Chuan-Hua, et al., "Dropwise condensation on superhydrophobic surfaces with two-tier roughness", Appl. Phys. Ltrs., 2007, vol. 90, pp. 173108-1-173108-3.
Chen, J., et al., "Functionalized Single-Walled Carbon Nanotubes as Rationally Designed Vehicles for Tumor-Targeted Drug Delivery", J. Am. Chem. Soc., 2008, vol. 130, pp. 16778-16785.
Choi, T.Y., et al., "Measurement of thermal conductivity of individual multiwalled carbon nanotubes by the 3-$\omega$ method", Appl. Phys. Letters, vol. 87, No. 1, 2005, pp. 013108-1-013108-3.
Conway, B.E., "Electromechanical Supercapacitors: Scientific Fundamentals and Technological Applications", Chapter 2—Similarities and Differences between Supercapacitors and Batteries for Storing Electrical Energy, 1999, pp. 11-31.
Correa-Duarte, M.A., et al., "Fabrication and Biocompatibility of Carbon Nanotube-Based 3D Networks as Scaffolds for Cell Seeding and Growth", Nano Letters, 2004, vol. 4, No. 11, pp. 2233-2236.
Correa-Duarte, M.A., et al., "Nanoengineered Polymeric Thin Films by Sintering CNT-Coated Polystyrene Spheres", Small, vol. 2, No. 2, 2006, pp. 220-224.
Crabtree, G.W., et al., "Solar energy conversion", Physics Today, vol. 60, No. 3, 2007, pp. 37-42.
Creel, C.J., et al., "Arterial Paclitaxel Distribution and Deposition", Circ. Res., vol. 86, No. 8, 2000, pp. 879-884.
Cui, D., et al., "Effect of single wall carbon nanotubes on human HEK293 cells", Toxicology Letters, 2005, vol. 155, pp. 73-85.
Dai, L., et al., "Functionalized surfaces based on polymers and carbon nanotubes for some biomedical and optoelectronic applications", Nanotechnology, vol. 14, No. 10, 2003, pp. 1084-1097.
Daniello, R.J., et al., "Drag reduction in turbulent flows over superhydrophobic surfaces", Physics of Fluids, 2009, vol. 21, pp. 085103-1-085103-9.
Daraio, C., et al., "Highly nonlinear contact interaction and dynamic energy dissipation by forest of carbon nanotubes", Appl. Phys. Ltrs., vol. 85, No. 23, pp. 5724-5726.
Davies, M.J., "The Composition of Coronary-Artery Plaques", The New England Journal of Medicine, 1997, vol. 336, No. 18, pp. 1312-1314.
Davis, S. P., et al., "Insertion of microneedles into skin: measurement and prediction of insertion force and needle fracture force", Journal of Biomechanics, 2004, vol. 34, pp. 1155-1163.
Detter, C., et al., "Fluorescent Cardiac Imaging : A Novel Intraoperative Method for Quantitative Assessment of Myocardial Perfusion During Graded Coronary Artery Stenosis", Circulation, 2007, vol. 116, pp. 1007-1014.
Diaz, J.F., et al., "Macromolecular Accessibility of Fluorescent Taxoids Bound at a Paclitaxel Binding Site in the Microtubule Surface", J. Biol. Chem., 2005, vol. 280, No. 5, pp. 3928-3937.
Elias, K.L., et al., "Enhanced functions of osteoblasts on nanometer diameter carbon fibers", Biomaterials, 2002, vol. 23, pp. 3279-3287.
Falvo, M.R., et al., "Bending and buckling of carbon nanotubes under large strain", Nature, vol. 389, 1997, pp. 582-584.
Fan, S., et al., "Self-Oriented Regular Arrays of Carbon Nanotubes and Their Field Emission Properties", Science, vol. 283, Jan. 1999, pp. 512-514.
Firkowska, I. et al., Highly Ordered MWNT-Based Matrixes: Topography at the Nanoscale Conceived for Tissue Engineering, Langmuir, vol. 22, 2006, pp. 5427-5434.
Frank, S., et al., "Carbon Nanotube Quantum Resistors", Science, vol. 280, 1998, pp. 1744-1746.
Futaba, D.N., et al., "Shape-engineerable and highly densely packed single-walled carbon nanotubes and their application as super-capacitor electrodes", Nature Materials, 2006, vol. 5, pp. 987-994.
Gabay, T., et al., Engineered self-organization of neural networks using carbon nanotube clusters Physica A, 2005, vol. 350, pp. 611-621.
Glazachev, Y.I., "Fluorescence Photobleaching Recovery Method with Pulse-Position Modulation of Bleaching/Probing Irradiation", J. Fluoresc., 2009, vol. 19, No. 5, pp. 875-880.
Guittet, M., et al., "Use of Vertically-Aligned Carbon Nanotube Array to Enhance the Performance of Electrochemical Capacitors", Proceedings of the 11$^{th}$ International Conference on Nanotechnology IEEE, 2011, pp. 1-6.
Haggenmueler, R., et al., "Aligned single-wall carbon nanotubes in composites by melt processing methods", Chemical Physical Letters, vol. 330, 2000, pp. 219-225.
Han, Z.J., et al., "Superhydrophobic amorphous carbon/carbon nanotube nanocomposites", Applied Physics Letters, 2009, vol. 94, pp. 223106-1-223106-3.
Haq, M.I., et al., "Clinical administration of microneedles: skin puncture, pain and sensation", Biomedical Microdevices, 2009, vol. 11, pp. 35-47.
Hart, A.J., et al., "Rapid Growth and Flow-Mediated Nucleation of Millimeter-Scale Aligned Carbon Nanotube Structures from a Thin-Film Catalyst", J. Phys. Chem. B, 2006, vol. 110, pp. 8250-8257.
Hattori, H., et al., "A Novel Real-Time fluorescent Optical Imaging System in Mouse Heart, A Powerful Tool for Studying Coronary Circulation and Cardiac Function", Circ Cardiovasc Imaging, 2009, vol. 2, pp. 277-278.
Hearn, E.M., et al., "Transmembrane passage of hydrophobic compounds through a protein channel wall", Nature, 2009, vol. 458, pp. 367-371.
Hinds, B.J., et al., "Aligned Multiwalled Carbon Nanotube Membranes", Science, vol. 303, 2004, pp. 62-65.
Holzapfel, G.A., et al., "Anisotropic Mechanical Properties of Tissue Components in Human Atherosclerotic Plaques", J. Bio. Eng., 2004, vol. 126, pp. 657-665.
Hong, Y.C., et al., "Superhydrophobicity of a material made from multiwalled carbon nanotubes", Applied Physics Letters, 2006, vol. 88, pp. 24401-1-24401-3.
Hosono, M. et al., "Intraoperative fluorescence imaging during surgery for coronary artery fistula", Interact CardioVasc Thorac Surg, 2010, vol. 10, pp. 476-477.
Hu, H., et al., "Chemically Functionalized Carbon Nanotubes as Substrates for Neuronal Growth", Nanoletters, 2004, vol. 4, No. 3, pp. 507-511.
Huang, H., et al., "Aligned Carbon Nanotube Composite Films for Thermal Management", Advanced Materials, vol. 17, No. 13, 2005, pp. 1652-1656.
Huang, L., et al., "Stable Superhydrophobic Surface via Carbon Nanotubes Coated with a ZnO Thin Film", J. Phys. Chem. B, 2005, vol. 109, pp. 7746-7748.
Huang, X., et al., "Inherent-opening-controlled pattern formation in carbon nanotube arrays", Nanotechnology, vol. 18, 2007, pp. 1-6.
Huber, C.A., et al, "Nanowire Array Composites", Science, vol. 263, 1994, pp. 800-802.
Huczko, A., et al., "Carbon Nanotubes: Experimental Evidence for a Null Risk of Skin Irritation and Allergy?", Fullerene Science and Technology, 2001, vol. 9, No. 2, pp. 247-250.
Huczko, A., et al., "Physiological Testing of Carbon Nanotubes: Are They Asbestos-Like?", Fullerene Science and Technology, 2001, vol. 9, No. 2, pp. 251-254.
Huczko, A., et al., "Pulmonary Toxicity of 1-D Nanocarbon Materials", Fullerenes, Nanotubes, and Carbon Nanostructures, 2005, vol. 13, pp. 141-145.

(56) References Cited

OTHER PUBLICATIONS

Ijima, S., "Helical microtubules of graphitic carbon", Nature, vol. 354, 1991, pp. 56-58.
Jia, G., et al., "Cytotoxicity of Carbon Nanomaterials: Single-Wall Nanotube, Multi-Wall Nanotube, and Fullerene", Environ. Sci. Technol., 2005, vol. 39, pp. 1378-1383.
Jin, L., et al., "Alignment of carbon nanotubes in• a polymer matrix by mechanical stretching", Applied Physics Letters, vol. 73, No. 9, 1998, pp. 1197-1199.
Jousseaume, V., et al., "Few graphene layers/carbon nanotube composites grown at complementary-metal-oxide-semiconductor compatible temperature", Applied Physics Letters, 2011, vol. 98, pp. 12103-1-12103-3.
Jung, Y.J., et al., "Aligned Carbon Nanotube-Polymer Hybrid Architectures for Diverse Flexible Electronic Applications", Nanoletters, vol. 6, No. 3, 2006, pp. 413-418.
Kam, N.W.S., et al., "Carbon nanotubes as multifunctional biological transporters and near-infrared agents for selective cancer cell destruction", PNAS, vol. 102, No. 33, 2005, pp. 11600-11605.
Kaushik, S., et al., "Lack of Pain Associated with Microfabricated Microneedles", Anesthesia & Analgesia, 2001, vol. 92, pp. 502-504.
Kazaoui, S., et al., "Near-infrared photoconductive and photovoltaic devices using single-wall carbon nanotubes in conductive polymer films", Journal of Applied Physics, 2005, vol. 98, pp. 084314-1-084314-6.
Kim, P., et al., "Thermal Transport Measurements of Individual Multiwalled Nanotubes", Physical Review Letters, vol. 87, No. 21, 2001, pp. 215502-1-2015502-4.
Kim, Yeu-Chun, et al., "Microneedles for drug and vaccine delivery", Adv. Drug Delivery Reviews, 2012, vol. 64, No. 14, pp. 1547-1568.
Kondo, D., et al., "Self-organization of Novel Carbon Composite Structure: Graphene Multi-Layers Combined Perpendicularly with Aligned Carbon Nanotubes", Applied Physics Express, 2008, vol. 1, No. 7, pp. 074003-1-074003-3.
Kopterides, P., et al., "Statins for sepsis: a critical and updated review", Clin Microbiol Infect, 2009, vol. 15, No. 4, pp. 325-334.
Krishnan, A., et al., "Young's modulus of single-walled nanotubes", Physical Review B, 1998, vol. 58, No. 20, pp. 14013-14015.
Lahiff, E., et al., "Selective Positioning and Density Control of Nanotubes within a Polymer Thin Film", Nanoletters, vol. 3, No. 10, 2003, pp. 1333-1337.
Lam, C.W., et al., "Pulmonary Toxicity of Single-Wall Carbon Nanotubes in Mice 7 and 90 Days After Intratracheal Instillation", Toxicol Sciences, 2004, vol. 77, pp. 126-134.
Lau, K., et al., "Superhydrophobic Carbon Nanotube Forests", Nanoletters, 2003, vol. 3, No. 12, pp. 1701-1705.
Lee, C., et al., "Measurement of the Elastic Properties and Intrinsic Strength of Monolayer Graphene", Science, 2008, vol. 321, pp. 385-388.
Lee, J.U., "Photovoltaic effect in ideal carbon nanotube diodes", Applied Physics Letters, vol. 87, No. 7, 2005, pp. 073101-1-073101-3.
Li, S., et al., "Super-Hydrophobicity of Large-Area Honeycomb-Like Aligned Carbon Nanotubes", J. Phys. Chem. B, 2002, vol. 106, pp. 9274-9276.
Li, W.Z., et al., "Large-Scale Synthesis of Aligned Carbon Nanotubes", Science, vol. 274, 1996, pp. 1701-1703.
Li, H., et al., "Super-"Amphiphobic" Aligned Carbon Nanotube Films", Angew. Chem. Int. Ed., 2001, vol. 40, No. 9, pp. 1743-1746.
Liu, Z., et al., "Drug delivery with carbon nanotubes for in vivo cancer treatment", Cancer Res., 2008, vol. 68, No. 16, pp. 6652-6660.
Lovich, M.A., et al., "Carrier Proteins Determine Local Pharmacokinetics and Arterial Distribution of Paclitaxel", J. Pharm. Sci., 2001, vol. 90, No. 9, pp. 1324-1335.
Lu, J.P., et al., "Carbon Nanotubes and Nanotube-Based Nano Devices", Int. J. Hi. Spe. Ele. Syst., 1998, vol. 9, No. 1, pp. 101-123.
Lyon, B., et al., "Carbon Nanotube Micro-needles for Rapid Transdermal Drug Delivery", APS DFD Meeting, San Diego, CA, Nov. 18, 2012.
Lyon, B., et al., "Feasibility Study of CNT for Rapid transdermal Drug Delivery", Mater. Res. Soc. Symp. Proc., 2013, vol. 1569, pp. 239-244.
Lyon, B., et al., "Feasibility Study of Carbon Nanotube Microneedles for Rapid Transdermal Drug Delivery", MRS Spring Meeting, San Francisco, CA, Apr. 2013.
Lyon, B., et al., "Carbon Nanotube—Polyimide Composite Microneedles for Rapid Transdermal Drug Delivery", Society of Biomaterials Meeting, Boston, MA, Apr. 2013.
Mamedov, A.A., et al., "Molecular design of strong single-wall carbon nanotube/polyelectrolyte multilayer composites", Nature Materials, 2005, vol. 1, No. 3, pp. 190-194.
Manohara, H.M., et al., "High-current-density field emitters based on arrays of carbon nanotube bundles", J. Vac. Sci. Tech B, 2005, vol. 23, No. 1, pp. 157-161.
Mckenzie, J.L., et al., "Decreased functions of astrocytes on carbon nanofiber materials", Biomaterials, 2004, vol. 25, pp. 1309-1317.
Melechko, A.V., et al., "Vertically aligned carbon nanofibers and related structures: Controlled synthesis and directed assembly", Journal of Applied Physics, vol. 97, No. 4, 2005, pp. 041301-1-041301-39.
Men, X.H., et al., "Superhydrophobic/superhydrophilic surfaces from a carbon nanotube based composite coating", Applied Physics A, 2009, pp. 1-6.
Migliavacca, F., et al., "Expansion and drug elution model of a coronary stent", Comput Methods Biomech Biomed Engin, 2007, vol. 10, No. 1, pp. 63-73.
Min, T., et al., "Effects of hydrophobic surface on skin-friction drag", Physics of Fluids, 2004, vol. 16, No. 7, pp. L55-L58.
Monteiro-Riviere, N.A., et al., "Multi-walled carbon nanotube interactions with human epidermal keratinocytes", Toxicol Letters, 2005, vol. 155, pp. 377-384.
Morjan, R.E., et al., "High growth rates and wall decoration of carbon nanotubes grown by plasma-enhanced chemical vapour deposition", Chemical Physics Letters, vol. 383, 2004, pp. 385-390.
Muller, J., et al., "Respiratory toxicity of multi-wall carbon nanotubes", Toxicol Appl Pharmacol, 2005, vol. 207, pp. 221-231.
Nerushev, O.A., et al., "The temperature dependence of Fe-catalysed growth of carbon nanotubes on silicon substrates", Physica B, vol. 323, 2002, pp. 51-59.
Nessim, G.D., et al., "Tuning of Vertically-Aligned Carbon Nanotube Diameter and Areal Density through Catalyst Pre-Treatment", Nano Letters., 2008, vol. 8, No. 11, pp. 3587-3593.
Noca, F., et al., "NanoWicks: Nanofiber-Patterned Surfaces for Passive Fluid Transport, Nanopumping, Ultrafiltration, Nanomixing, and Fluidic Logic", NASA Tech Briefs, 2007, pp. 1-7.
Oreopoulos, J., et al., "Combinatorial microscopy for the study of protein-membrane interactions in supported lipid bilayers: Order parameter measurements by combined polarized TIRFM/AFM", J. Struct. Biol., 2009, vol. 168, pp. 21-36.
Panchagnula, R., et al., "Effect of Lipid Bilayer Alteration on Transdermal Delivery of a High-Molecular-Weight and Lipophilic Drug: Studies with Paclitaxel", J. Pharm. Sci., 2004, vol. 93, No. 9, pp. 2177-2183.
Pandolfo, A.G., et al., "Carbon properties and their role in supercapacitors", Journal of Power Sources, 2006, vol. 157, pp. 11-27.
Parekh, H., et al., "The Transport and Binding of Taxol", Gen. Pharmac., 1997, vol. 29, No. 2, pp. 167-172.
Pernodet, N., et al., "Pore size of agarose gels by atomic force microscopy", Electrophoresis, 1997, vol. 18, pp. 55-58.
Prausnitz, M.R., et al., "Transdermal drug delivery", Nature Biotechnology, 2008, vol. 26, No. 11, pp. 1261-1268.
Price, R.L., et al., "Selective bone cell adhesion on formulations containing carbon nanofibers", Biomaterials, 2003, vol. 24, pp. 1877-1887.
Raravikar, N.R., et al., "Synthesis and Characterization of Thickness-Aligned Carbon Nanotube-Polymer Composite Films", Chem. Mater., vol. 17, No. 5, 2005, pp. 974-983.
Raravikar, N.R., et al., "Embedded Carbon-Nanotube-Stiffened Polymer Surfaces", Small, vol. 1, No. 3, 2005, pp. 317-320.
Ren, Z.F., et al., "Synthesis of Large Arrays of Well-Aligned Carbon Nanotubes on Glass", Science, vol. 282, 1998, pp. 1105-1107.

(56) References Cited

OTHER PUBLICATIONS

Roxhed, N., et al., "Painless Drug Delivery Through Microneedle-Based Transdermal Patches Featuring Active Infusion", IEEE Transactions on Biomedical Engineering, 2008, vol. 55, No. 3, pp. 1063-1071.

Ruoff, R.S., et al., "Is $C_{60}$ stiffer than diamond?", Nature, 1991, vol. 350, pp. 663-664.

Sansom, E.B., "Experimental Investigation on Patterning of Anchored and Unanchored Aligned Carbon Nanotube Mats by Fluid Immersion and Evaporation", PhD Thesis, California Institute of Technology, Pasadena, CA, 2007.

Sansom, E.B., et al., "Controlled partial embedding of carbon nanotubes within flexible transparent layers", Nanotechnology, vol. 19, No. 3, 2008, pp. 1-6.

Scheller, B., et al., "Paclitaxel Balloon Coating, a Novel Method for Prevention and Therapy of Restenosis", Circulation, vol. 110, No. 7, 2004, pp. 810-814.

Scheuplein, R.J., et al., "Permeability of the Skin", Physiological Reviews, 1971, vol. 51, No. 4, pp. 702-747.

Scheuplein, R.J., Chapter 19: Permeability of the skin, Handbook of Physiology—Reactions to Environmental Agents, 2011, pp. 299-322.

Sethi, S., et al., "Gecko-Inspired Carbon Nanotube-Based Self-Cleaning Adhesives", Nanoletters, vol. 8, No. 3, 2008, pp. 822-825.

Shvedova, A.A., et al., "Exposure to Carbon Nanotube Material: Assessment of Nanotube Cytotoxicity Using Human Keratinocyte Cells", J. Toxicol. Environ. Health, Pat A, 2003, vol. 66, pp. 1909-1926.

Sinha, N., et al., "Carbon Nanotubes for Biomedical Applications", IEEE Transactions on Nanobioscience, vol. 4, No. 2, 2005, pp. 180-195.

Suh, J.S., et al., "Highly ordered two-dimensional carbon nanotube arrays", Applied Physics Letters, vol. 75, No. 14, 1999, pp. 2047-2049.

Talapatra, S., et al., "Direct Growth of Aligned Carbon Nano-tubes on Bulk Metals", Nature Nanotechnology, 2006, vol. 1, pp. 112-116.

Tamura, K., et al., "Effects of Micro/Nano Particle Size on Cell Function and Morphology", Key Engineering Materials, 2004, vols. 254-256, pp. 919-922.

Tanaka, E., et al., "Real-Time Assessment of Cardiac Perfusion, Coronary Angiography, and Acute Intravascular Thrombi Using Dual-Channel Near-Infrared Fluorescence Imaging", Thorac Cardiovasc Surg., 2009, vol. 138, No. 1, pp. 133-140.

Tepe, G., et al., "Paclitaxel-coated Angioplasty Catheters for Local Drug Delivery", Touch Briefings—Interventional Cardiology, 2007, pp. 61-63.

Tian, B., et al., "Coaxial silicon nanowires as solar cells and nanoelectronic power sources", Nature, vol. 449, 2007, pp. 885-888.

Veedu, V.P., et al., "Multifunctional composites using reinforced laminae with carbon-nanotube forests", Nature Materials, 2006, vol. 5, pp. 457-462.

Wagner, H.D., et al., "Stress-induced fragmentation of multiwall carbon nanotubes in a polymer matrix", Applied Physics Letters, vol. 72, No. 2, 1998, pp. 188-190.

Wang, G.X., et al., "Growth and Lithium Storage Properties of Vertically Aligned Carbon Nanotubes", Metals and Materials Intl, 2006, vol. 12, No. 5, pp. 413-416.

Wang, Z., et al., "Impact dynamics and rebound of water droplets on superhydrophobic carbon nanotube arrays", Applied Physics Letters, 2007, vol. 91, pp. 023105-1-023105-3.

Wardle, B.L., et al., "Fabrication and Characterization of Ultrahigh-Volume-Fraction Aligned Carbon Nanotube-Polymer Composites", Adv. Mater., 2008, vol. 20, pp. 2707-2714.

Warheit, D.B., et al., "Comparative Pulmonary Toxicity Assessment of Single-wall Carbon Nanotubes in Rats", Toxicol. Sciences, 2004, vol. 77, pp. 117-125.

Waseda, K., et al., "Intraoperative Fluorescence Imaging System for On-Site Assessment of Off-Pump Coronary Artery Bypass Graft", JACC: CardioVasc Imaging, 2009, vol. 2, No. 5, pp. 604-612.

Webster, T.J., et al., "Nano-biotechnology: carbon nanofibres as improved neural and orthopaedic implants", Nanotechnology, 2004, vol. 15, pp. 48-54.

Wermeling, D.P., et al., "Microneedles permit transdermal delivery of a skin-impermeant medication to humans", PNAS, 2008, vol. 105, No. 6, pp. 2058-2063.

Wong, E.W., et al., "Nanobeam Mechanics: Elasticity, Strength, and Toughness of Nanorods and Nanotubes", Science, vol. 277, 1997, pp. 1971-1975.

Wu, W., et al., "Covalently Combining Carbon Nanotubes with Anti-cancer Agent: Preparation and Antitumor Activity", ACS Nano, 2009, vol. 3, No. 9, pp. 2740-2750.

Zhu, L., et al., "Superhydrophobicity om Two-Tier Rough Surfaces Fabricated by Controlled Growth of Algined Carbon Nanotube Arrays Coated with Fluorocarbon", Langmuir, 2005, vol. 21, pp. 11208-11212.

Xie, XL, et al., "Dispersion and alignment of carbon nanotubes in polymer matrix: A review", Mat. Science and Engineering R, vol. 49, No. 4, 2005, pp. 89-112.

Xu, J., et al., "Enhanced Thermal Contact Conductance Using Carbon Nanotube Array Interfaces", IEEE Transactions on Components and Packaging Technologies, 2006, vol. 29, No. 2, p. 261-267.

Xu, Z., et al., "Multiwall Carbon Nanotubes Made of Monochirality Graphite Shells", J. Am. Chem. Soc., vol. 128, No. 4, 2006, pp. 1052-1053.

Yang, D, et al., "Hydrophilic multi-walled carbon nanotubes decorated with magnetite nanoparticles as lymphatic targeted drug delivery vehicles", Chem. Commun., 2009, pp. 4447-4449.

Yang, ZP, et al., "Experimental Observation of an Extremely Dark Material Made by a Low-Density Nanotube Array", Nanoletters, vol. 8, No. 2, 2008, pp. 446-451.

Yurdumakan, B., et al., "Synthetic gecko foot-hairs from multiwalled carbon nanotubes", Chem. Comm., vol. 30, 2005, pp. 3799-3801.

Zhang, L., et al., "Single-Walled Carbon Nanotube Pillars: A Superhydrophobic Surface", Langmuir, 2009, vol. 25, No. 8, pp. 4792-4798.

Zhao, L., et al., "Porous Silicon and Alumina as Chemically Reactive Templates for the Synthesis of Tubes and Wires of SnSe, Sn, and $SnO_2$", Angew. Chem. Int. Ed., vol. 45, 2006, pp. 311-315.

Zhou, J.J., et al., "Flow conveying and diagnosis with carbon nanotube arrays", Nanotechnology, vol. 17, No. 19, 2006, pp. 4845-4853.

Zilberman, M., et al., "Paclitaxel-eluting composite fibers: Drug release and tensile mechanical properties", J, Biomed. Mater, Res., 2008, vol. 84A, pp. 313-323.

\* cited by examiner

NANO TRI-CARBON COMPOSITE SYSTEMS AND MANUFACTURE

CROSS-REFERENCE TO RELATED APPLICATIONS

This application claims priority to and the benefit of U.S. Provisional Patent Application Ser. Nos. 61/677,115 and 61/677,132, each filed Jul. 30, 2012, and each of which is incorporated herein by reference in its entirety for all purposes.

FIELD

The embodiments described herein relate to composites of nano-carbon materials including spherical fullerenes, carbon nanotubes, and graphene.

BACKGROUND

Nano-carbon materials including spherical fullerenes, carbon nanotubes (CNTs), and graphene have long been praised for their high electrical and thermal conductivity as well as their superior mechanical strength. See: J. Lu, J. Han, *Int. J. High Speed Electron. Sys.* 9, 101, 1998; R. Ruoff, A. Ruoff, *Nature* 350, 663-4, 1991 and C. Lee et al, *Science* 321, 385, 2008. However, each carbon allotrope is limited individually by their rigid shaping and specific mechanical shortcomings.

The general concept of composite engineering is to combine dissimilar materials, taking advantage of the unique properties of each material in a synergetic fashion. For sporting goods, aerospace products, etc., the mixing-and-matching of a selection of fiberglass, carbon fiber, KEVLAR, etc. reinforcing fiber, and polymer matrix material (selected from various thermoplastic and thermoset resins encapsulating the fibers) is well known.

However, the same is not properly said of nano-composite engineering and design. Here, a vast range of new material combinations, manufacturing techniques, and constructions and uses to which such constructions may be put have yet to be realized in the industry.

A tremendous need exists where these new technologies are applied to energy-related requirements where current limitations of battery and capacitor/super-capacitor design are limiting advancements in applications ranging from the miniaturization of personal electronics to the large-scale implementation of electric vehicle transportation.

SUMMARY

Nano-carbon material, hereafter referred to as Nano Tri-Carbon (NTC) composite, is described that combines the common and unique properties of spherical fullerenes, carbon nanotubes (CNTs) and graphene carbon allotropes to create an architecture that has unique mechanical and electrical properties emanating from the configuration of each allotrope in the composite. For various applications, the NTC composite can be patterned to allow the composite to be scaled from the nano-scale to the macro-scale. The NTC is composed of the fusion of two sub-composites: graphene-nanotubes and nanotube-fullerenes.

Mechanically, the configuration of the NTC combines the tensile strength of nanotubes and graphene with the compressive strength of fullerenes to create a material that has high strength in both tension and compression that is unique to any other nano-carbon composite. In applications of energy storage, the use of nanotube-fullerenes is suitable for building high capacitance electrodes. With the unique patterning ability of the NTC (discussed below), a supercapacitor can be built on the NTC platform that is compact and able to handle large electrical loads, even with the potential to handle power-plant grade loads.

The subject NTC composites, products (be they consumer goods, industrial hardware, etc.), methods of use, and methods of manufacture are all included within the present description.

Other products, composites, systems, devices, methods, features, and advantages of the subject matter described herein will be or will become apparent to one with skill in the art upon examination of the following figures and detailed description. It is intended that all such additional products, composites, systems, devices, methods, features, and advantages be included within this description, be within the scope of the subject matter described herein, and be protected by the accompanying claims. In no way should the features of the example embodiments be construed as limiting the appended claims, absent express recitation of those features in the claims.

BRIEF DESCRIPTION OF THE DRAWINGS

The figures diagrammatically illustrate example embodiments with similarly-depicted elements variously numbered in the figures. Embodiment variations other than those shown in the figures are contemplated as described in a broader sense herein, as generically claimed, or otherwise.

DETAILED DESCRIPTION

Figure 1:
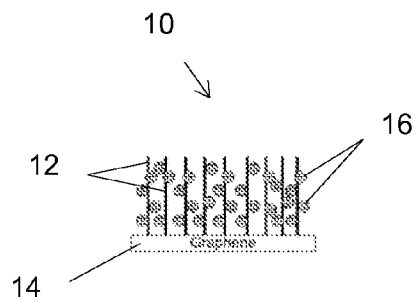
FIG. 1 is a schematic of an example embodiment of an NTC composite and its subcomponents.

Various exemplary embodiments are described below. Reference is made to these examples in a non-limiting sense, as it should be noted that they are provided to illustrate more broadly applicable aspects of the devices, systems and methods. Various changes may be made to these embodiments and equivalents may be substituted without departing from the true spirit and scope of the various embodiments. In addition, many modifications may be made to adapt a particular situation, material, composition of matter, process, process act(s) or step(s) to the objective(s), spirit or scope of the present subject matter. All such modifications are intended to be within the scope of the claims made herein.

As referenced above, the subject NTC composite comprises the fusion of two sub-composites of carbon allotropes: graphene-nanotubes and nanotubes-fullerenes. These allotropes are discussed, in turn.

Graphene-Nanotubes

Previous efforts by several research groups have demonstrated the ability to simultaneously fabricate graphene and nanotubes through chemical vapor deposition. However, the simultaneous nature of the growth process does not allow for the structure of the nanotubes or graphene to be individually modified. See: Kondo et al, Applied Physics Express 1, 2008; Jousseaume et al, Applied Physics Letters 98, 2011.

In the subject fabrication processes, graphene and nanotubes are fabricated independently, thus allowing for individual tuning of the structure of each component. In this way, the structure of the graphene-nanotube composite and the NTC can be optimized for a variety of applications ranging from structural to electrochemical. By using graphene as an anchoring substrate, the composite is not dependent on the type of bulky macro-scale substrates that are typically used to hold nanostructures. Given the compact and light-weight structure of the graphene-nanotubes composite and the NTC, both composites lend themselves easily to patterning.

Nanotubes-Fullerenes

In US Patent Publication No. 2012/0250225 (commonly-assigned and published Oct. 4, 2012 to the same inventors hereof), the concept of attaching nanoparticles, including the possibility of attaching fullerenes, to nanotubes is disclosed as a means to increase capacitance of electrochemical carbon nanotube capacitors by using the nanoparticles to increase the surface area of the nanotube array. Vertically aligned nanotubes act as a skeleton for fullerene attachment ensuring even distribution of fullerenes throughout the composite. Fullerenes prove highly advantageous due to the high electronic, structural, and chemical compatibility between the nanotubes and fullerenes due to common carbon structure.

Fullerenes are very good electrical conductors as well as extremely strong under compression, thereby benefiting overall properties of the NTC composite. Vertically aligned nanotubes are already well-known for their extremely high surface area to weight ratio. By the addition of fullerenes to the nanotubes, the surface area to weight ratio can be improved by a factor of about two to about three.

This high surface area maximizes surface interactions between the NTC and its surrounding environment. Maximization of surface interactions is useful for diverse applications ranging from but not limited to sensitive gas detection, high density charge separation in electrochemical double layer capacitors (i.e., supercapacitors), and analytic microfluidics.

Nano Tri-Carbon Composites

The subject NTC composites realize a synergy of the graphene-nanotubes and nanotubes-fullerenes composite to create a new and versatile nano-scale material. From the graphene-nanotube (pre)structure, the NTC is highly patternable due the use of graphene as a nano-scale anchoring platform for nanotubes. From the nanotubes-fullerenes composite, the overall NTC composite offers a remarkably high surface area to weight ratio that enables the device to have very strong surface interactions with its surrounding environment.

FIG. 1 is a schematic of Nano Tri-Carbon (NTC) composite 10. Vertically aligned carbon nanotubes 12 are shown grown from catalyst deposited on or near graphene 14. The nanotubes are shown acting as skeletal structure for placing nanoparticles (such as fullerenes 16) throughout the interspacing. Graphene acts as a nano-scale substrate which ultimately allows for patterning of the NTC.

Supercapacitors

Supercapacitors store large amounts of energy while allowing for power uptake and delivery rates far higher than conventional batteries. Thus, supercapacitors allow for efficient capture of intermittent renewable energy sources such as wind and solar power.

Figure 2:
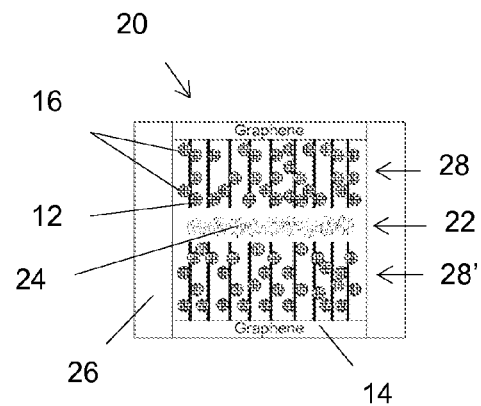
FIG. 2 is a schematic of an example embodiment of a Unit Cell of NTC composite for electrical supercapacitor application.

Per above, the enhanced surface area to volume ratio of the fullerene-nanotube complex offers significant potential advantages in supercapacitor construction. As shown in FIG. 2, a supercapacitor unit cell 20 may be constructed by sandwiching two NTC composite elements 10 on top of (i.e., facing) each other and filling the interspacing 22 with electrolyte 24. Nonconductive polymer 26 may wrap around the composite to add structural support for the graphene layers.

In the unit cell, each nanotube-fullerene complex acts as an electrode 28/28'. A voltage difference across the electrodes causes charge separation in the electrolyte-filled gap region ("G") that acts as the energy storage mechanism.

The graphene 14 works as a current collector at the end of each electrode. Using graphene greatly increases the capacitance per unit mass of the NTC supercapacitor over conventional supercapacitors that use macro-scaled metals for current collectors.

Moreover, the slimness of the graphene layer enables individual unit cells to be stacked together to allow for compact scaling of the supercapacitor. Currently, conventional supercapacitor cells are limited to handling 1-3 Volts.

By using nanomaterials, exclusively, it is possible pattern the subject unit cell supercapacitor to connect supercapacitors in series or in parallel in order to handle much larger electrical loads. Consequently, the subject NTC supercapacitor can be feasibly scaled to handle electrical loads from commercial power plants.

Generalized NTC Composite Fabrication

The NTC composite can be fabricated by three steps: fabrication of a graphene-nanotube subcomposite, addition of fullerenes by surface functionalization, and etching of the bulk substrate. The graphene-nanotube subcomposite can be fabricated by two different methods paths depending on the preparation of the catalyst layer of the nanotubes and graphene. A process path 100 shown in FIG. 3A employs graphene catalyst and nanotube catalyst deposited in two separate layers such as nickel and iron, respectively. To maintain a distinct boundary between layers, a buffer layer such as a polymer or oxide may be used. In contrast, a process 200 in FIG. 3B combines the graphene and nanotube catalyst into a single layer such as an alloy of iron and nickel. Given the many different catalyst choices available, iron (Fe) is referred to as the nanotube catalyst and nickel (Ni) as the graphene catalyst. In the FIG. 3A process, graphene and nanotubes fabrication are independent as the fabrication occurs in sequential non-overlapping steps. As such, the graphene and nanotube growth can be individually tuned by changing the proportions and layering of the individual catalyst particles.

After fabricating the graphene-nanotube sub-composite (by either the FIG. 3A or FIG. 3B approach), fullerenes (or generically nanoparticles) are attached to the nanotubes as described in the US Patent Publication No. 2012/0250225, above, incorporated by reference herein in its entirety. Next, the support (and remaining catalyst layers) on the bottom of the composite are etched away to finish fabrication of the NTC.

Figures 3A, 3B:
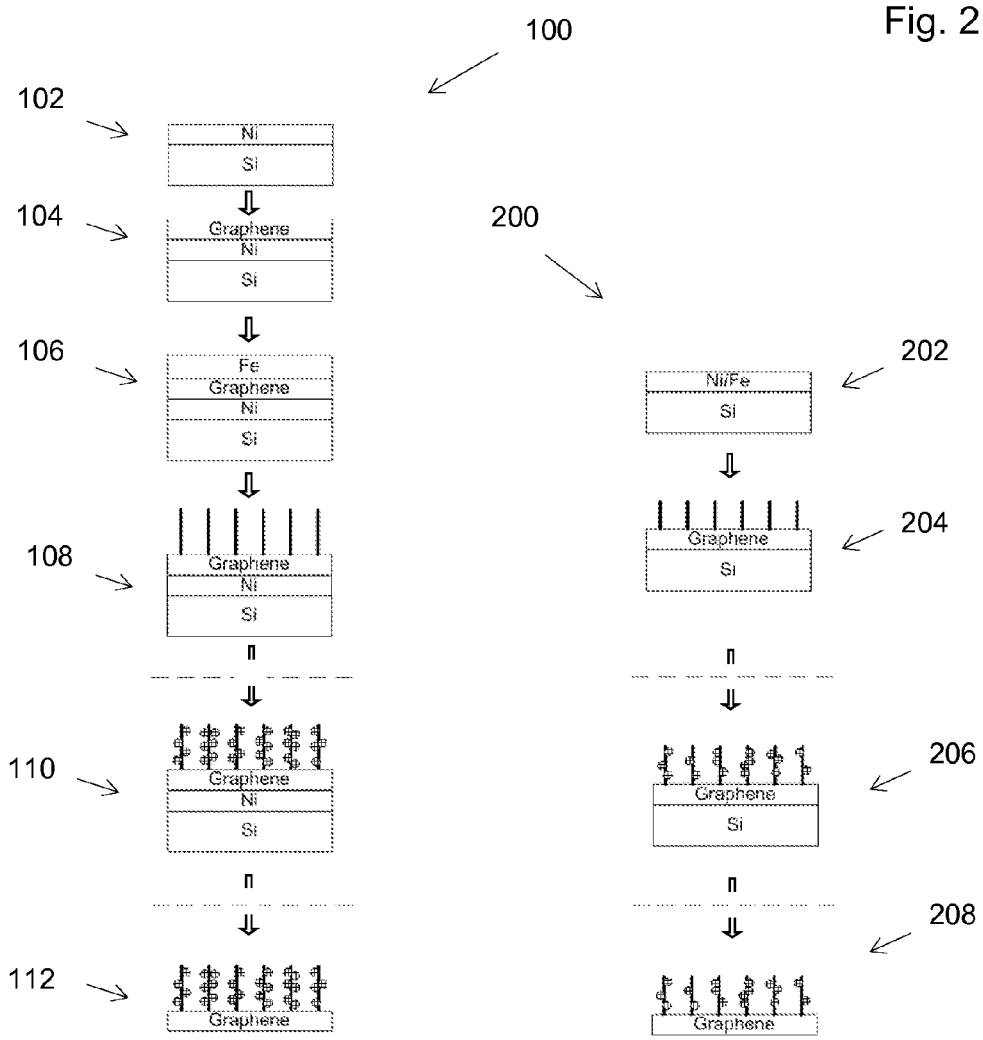
FIGS. 3A and 3B are schematics illustrating alternative examples of manufacturing process pathways for generalized NTC composite material.

With more specific reference to FIG. 3A, process 100 starts at 102 by evaporating catalyst for graphene on a substrate such as silicon and then growing graphene via hydrocarbon chemical vapor deposition (CVD) at 104. Next, nanotubes are fabricated by depositing nanotube catalyst at 106 and then assembling the nanotubes in CVD at 108. With the nanotube-graphene structure set, fullerenes or other nanoparticles can be attached to the nanotubes through surface functionalization at 110. Finally, the nickel and silicon substrate is etched away at 112 to leave a freestanding structure.

At this point, the NTC can also be transferred to other substrates such as flexible polymer (not shown).

With more specific reference to FIG. 3B, process 200 beings at 202 by evaporating a catalyst that simultaneously triggers graphene and nanotube growth at such as the aforementioned nickel and iron alloy. By changing the proportion and patterning of the alloy, the structure of the graphene and nanotubes can be individually adjusted. At 204, CVD is performed to grow the graphene-nanotube structure. At 206, fullerenes or other nanoparticles are attached to the nanotubes through surface functionalization. At 208, the nickel and silicon substrate is etched away to leave a freestanding structure. Again, the NTC can then be transferred to other substrates such as flexible polymer.

NTC Composite Supercapacitor Fabrication

Fabrication of the supercapacitor unit cell 20 can be accomplished by two different fabrication techniques. Similar to the method if FIG. 3A, method 300 in FIG. 4A employs graphene catalyst and nanotube catalyst (such as nickel and iron, respectively) that are deposited in two separate layers. Again, to maintain a distinct boundary between layers a buffer layer (not shown) such as a polymer or oxide may be used. Likewise, similar to the method in FIG. 3B, method 400 in FIG. 4B combines the graphene and nanotube catalyst into a single layer such as cobalt or an alloy of iron and nickel. And, again, given the many different catalyst choices available, for simplicity, iron (Fe) is referred to as the CNT catalyst and nickel (Ni) as the graphene catalyst.

Notably, the supercapacitor can also be constructed with the omission of fullerene attachment to the nanotubes (per steps 320/418, below). However, such omission will be at the cost of reduced supercapacitor performance.

Figures 4A, 4B:
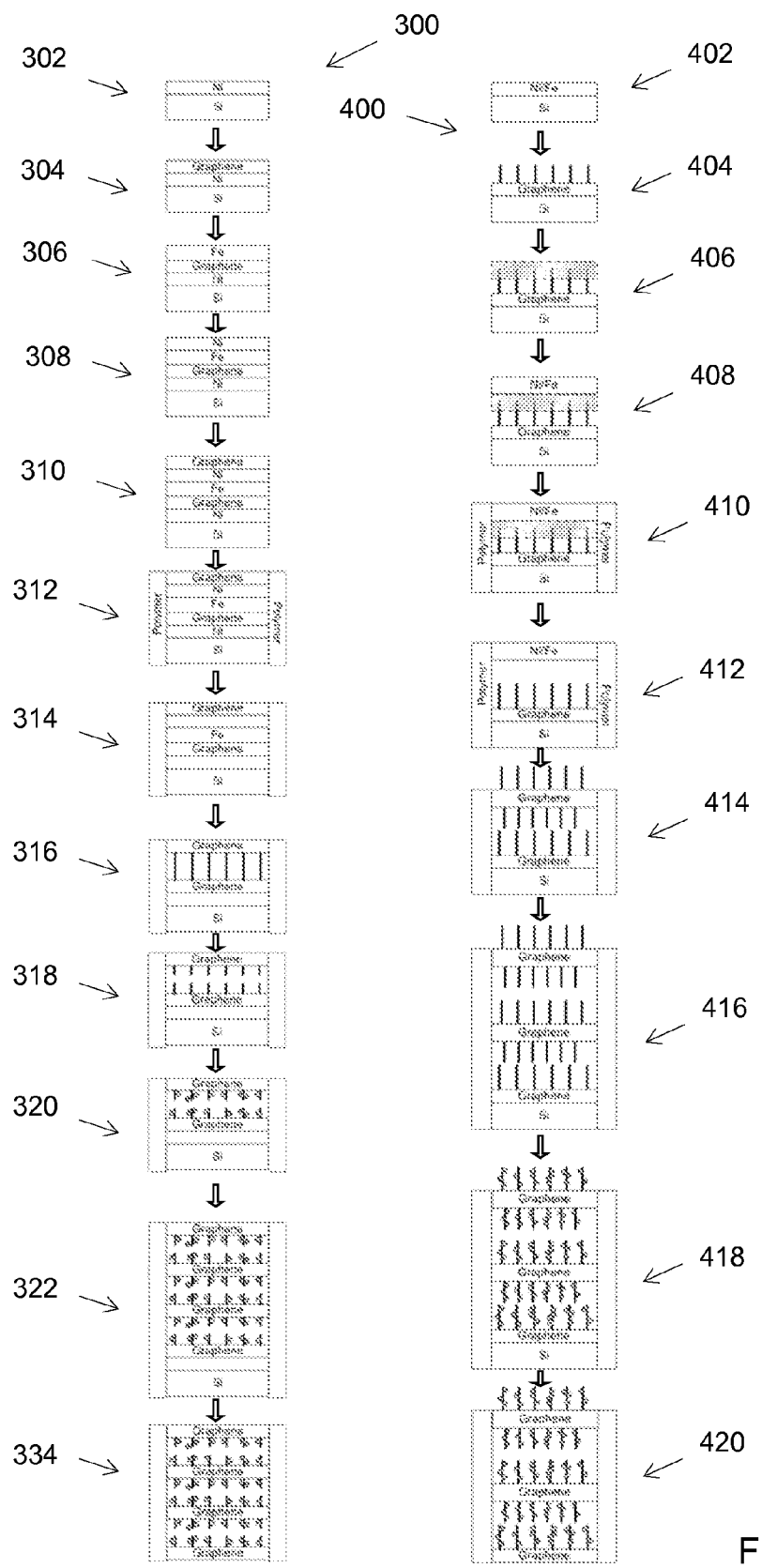
FIGS. 4A and 4B are schematics illustrating alternative examples of manufacturing process pathways for NTC super-conductor unit cells.

In any case, FIG. 4A illustrates a process 300 where a bottom graphene layer is fabricated by depositing the nickel catalyst layer on silicon at 302 and then performing hydrocarbon chemical vapor deposition (CVD) at 304. As above, several types of hydrocarbon gases can be used including methane or ethylene. At 306 and 308, iron and nickel are deposited, respectively. The newly deposited Ni layer forms the top graphene layer via a second round of hydrocarbon CVD at 310. To support the graphene layers, flexible polymer is deposited along the sides of the structure at 312. With both graphene layers fabricated, the remaining nickel is etched at 314 to create a gap for nanotube growth. At 316, Hydrocarbon CVD is performed to generate nanotubes. At 318, the nanotubes are then etched in the center of the cell to create two distinct opposing electrodes in separated columns. This completes one unit cell. At 320, fullerenes can now be attached to the nanotubes as referenced above. The fullerenes attached to the nanotubes make up the high surface area electrodes. Steps 306 through 320 are essentially repeated to generate additional unit cells resulting in the body at 322. After patterning, the unit cells are filled with electrolyte. Finally, at 334, the silicon substrate is etched to complete fabrication of the NTC supercapacitor.

FIG. 4B illustrates a process 400 that starts by depositing nickel and iron on a silicon substrate at 402. In process 400, iron and nickel layers are mixed for various reasons including that the layers are deposited on the wafer at the same time, the layers are heat treated to create an alloy, or a single catalyst material is used to generate both nanotubes and graphene such as nickel or cobalt. After such deposition at 402, a hydrocarbon CVD process at 404 results in the simultaneous growth of the bottom layer graphene and the nanotubes. To produce a top surface for catalyst deposition, the top of the nanotubes are anchored 406 in a flexible polymer such as PDMS. Next, at 408, iron and nickel are deposited on top of the flexible polymer.

For structural support, the unit cell is wrapped at 410 in a flexible polymer to provide structural support for the unit cell. At 410, the PDMS (or whatever other polymer was employed) is etched with the top Ni/Fe layer being supported by the lateral polymer support. Hydrocarbon CVD is then performed to fabricate the top layer of graphene and nanotubes at 414. By modifying the growth time of hydrocarbon CVD, the spacing between the nanotube-fullerene electrodes can be controlled.

Steps 406 through 414 are essentially repeated to generate to create a stacked unit cell as in 416. After completing graphene and nanotube fabrication, fullerenes can be attached via surface functionalization as shown 418. Next, the unit cells are filled electrolyte. Finally, the original Si substrate and overhanging polymer can be removed via etching to complete fabrication of the NTC supercapacitor at 420.

Variations

NTC composites, methods of NTC composite manufacture and the application of the NTC composite to create supercapacitor architectures have been disclosed. Various other applications of the subject produces have been noted. Of these, in a preferred embodiment of the subject supercapaciter, the high surface area of the fullerenes and nanotubes combined with the low-mass of all nano-carbon materials creates supercapacitors that can store high densities of electrical energy and are highly scalable. The scalability of the supercapacitor illustrated offers potential for the NTC to compactly handle commercial grade electrical loads thus making NTC supercapacitors a potentially key component in generating power from intermittent renewable energy sources.

Reference to a singular item includes the possibility that there are a plurality of the same items present. More specifically, as used herein and in the appended claims, the singular forms "a," "an," "said," and "the" include plural referents unless specifically stated otherwise. In other words, use of the articles allow for "at least one" of the subject item in the description above as well as the claims below. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

Without the use of such exclusive terminology, the term "comprising" in the claims shall allow for the inclusion of any additional element—irrespective of whether a given number of elements are enumerated in the claim, or the addition of a feature could be regarded as transforming the nature of an element set forth in the claims. Except as specifically defined herein, all technical and scientific terms used herein are to be given as broad a commonly understood meaning as possible while maintaining claim validity.

The invention claimed is:

1. A method of tri-nano-carbon composite product manufacture, the method comprising:
   depositing a catalyst for graphene and a catalyst for carbon nanotubes (CNTs) on a substrate;
   growing graphene and CNTs;
   attaching fullerenes to the CNTs; and
   etching the substrate.

2. The method of claim 1, wherein the catalyst for graphene and the catalyst for CNTs each comprises an alloy, the method comprising depositing the catalysts together.

3. The method of claim 2, wherein the graphene and CNTs are grown simultaneously.

4. The method of claim 1, wherein the catalyst for graphene and the catalyst for CNTs comprises comprise separate layers, and the method comprises depositing the layers separately.

5. The method of claim 4, wherein the graphene and CNT are grown separately.

6. The method of claim 1, wherein the substrate is selected from silicon and silicon oxide.

7. The method of claim 1, further comprising repeating the growing of graphene and CNTs.

8. The method of claim 7, wherein the CNTs are etched to form separated columns.

9. The method of claim 1, further comprising anchoring a top of the CNTs in a polymer.

10. The method of claim 9, further comprising depositing a catalyst on the polymer.

11. The method of claim 10, further comprising etching the anchoring polymer.

12. The method of claim 11, further comprising, again, growing graphene and CNTs.

13. The method of claim 1, further comprising filling a gap between CNTs with electrolyte.

14. The method of claim 1, further comprising adding a polymer to structurally support a unit cell.

* * * * *